US012735803B2

(12) United States Patent
Wang et al.

(10) Patent No.: US 12,735,803 B2
(45) Date of Patent: Sep. 15, 2026

(54) CHARGING METHOD FOR SILICON MATERIAL AND PREPARATION METHOD FOR SINGLE CRYSTAL

(71) Applicant: TCL ZHONGHUAN RENEWABLE ENERGY TECHNOLOGY CO., LTD., Tianjin (CN)

(72) Inventors: Lin Wang, Tianjin (CN); Guoqing Fan, Tianjin (CN); Zhi Yang, Tianjin (CN); Haoyang Wu, Tianjin (CN); Long Xiang, Tianjin (CN); Lei Li, Tianjin (CN)

(73) Assignee: TCL ZHONGHUAN RENEWABLE ENERGY TECHNOLOGY CO., LTD., Tianjin (CN)

( * ) Notice: Subject to any disclaimer, the term of this patent is extended or adjusted under 35 U.S.C. 154(b) by 265 days.

(21) Appl. No.: 18/555,463

(22) PCT Filed: Sep. 4, 2023

(86) PCT No.: PCT/CN2023/116782

§ 371 (c)(1), (2) Date: Oct. 13, 2023

(87) PCT Pub. No.: WO2025/050248

PCT Pub. Date: Mar. 13, 2025

(65) Prior Publication Data

US 2025/0092561 A1 Mar. 20, 2025

(51) Int. Cl.
*C30B 15/10* (2006.01)
*C30B 15/14* (2006.01)
(Continued)

(52) U.S. Cl.
CPC .............. *C30B 15/10* (2013.01); *C30B 15/14* (2013.01); *C30B 15/20* (2013.01); *C30B 15/30* (2013.01); *C30B 29/06* (2013.01)

(58) Field of Classification Search
CPC ......... C30B 15/00; C30B 15/10; C30B 15/14; C30B 15/20; C30B 15/30; C30B 29/06; C30B 35/007
See application file for complete search history.

(56) References Cited

U.S. PATENT DOCUMENTS

2010/0107966 A1* 5/2010 Javidi ..................... C30B 15/00 117/35
2011/0174214 A1* 7/2011 Horioka .................. C30B 15/02 117/223
2016/0060787 A1* 3/2016 Park ........................ C30B 29/06 117/214

FOREIGN PATENT DOCUMENTS

CN 102242397 A * 11/2011
CN 102732945 A * 10/2012
(Continued)

OTHER PUBLICATIONS

International Search Report in International application No. PCT/CN2023/116782, mailed on May 21, 2024.
(Continued)

*Primary Examiner* — Hua Qi
(74) *Attorney, Agent, or Firm* — PV IP PC; Christopher S. Ruprecht; Wei Te Chung

(57) ABSTRACT

A charging method of silicon material and a preparation method for single crystal are provided. The charging method includes: disposing the first material layer in the crucible; and disposing a second material layer on a side of the first material layer away from a bottom of the crucible, to cover the first material layer during vacuuming. The method for preparing a single crystal, using the silicon charging method described above. The preparation method for single crystal used the charging method for silicon material includes: covering a pot lid on the crucible to define a closed crucible body, and vacuuming the closed crucible body; lifting the
(Continued)

closed crucible body into a single crystal furnace, and relieving pressure from the closed crucible body.

20 Claims, 3 Drawing Sheets

(51) Int. Cl.
*C30B 15/20* (2006.01)
*C30B 15/30* (2006.01)
*C30B 29/06* (2006.01)

(56) References Cited

FOREIGN PATENT DOCUMENTS

CN 202595328 U * 12/2012
CN 103233264 A * 8/2013
CN 113430645 A 9/2021
CN 114086243 A 2/2022
CN 115467022 A 12/2022
CN 115710745 A 2/2023

OTHER PUBLICATIONS

Written Opinion of the International Search Authority in International application No. PCT/CN2023/116782, mailed on May 21, 2024.

* cited by examiner

CHARGING METHOD FOR SILICON MATERIAL AND PREPARATION METHOD FOR SINGLE CRYSTAL

CROSS-REFERENCE TO RELATED APPLICATION

This application is a national stage of International Application No. PCT/CN2023/116782, filed on Sep. 4, 2023. The aforementioned application is hereby incorporated by reference in its entirety.

TECHNICAL FIELD

The present application relates to the technical field of single crystal growth, and particularly relates to a charging method for a silicon material for raw polycrytalline silicon powder in a Czochralski single crystal furnace and a preparation method for a single crystal.

BACKGROUND

Raw polycrystalline silicon powder refers to a byproduct produced in a process of producing a granular material by using a fluidized bed method. The process of producing the silicon powder mainly includes: using a fluidized bed method, using silane or chlorosilane as a silicon raw gas, using hydrogen as a carrier gas to lead the silane or chlorosilane to the fluidized bed with a polysilicon seed crystal as fluidized particles, and performing cleavage and deposition on the seed crystal to obtain granular polycrytalline silicon. During reaction, silane gas rapidly decomposes after entering the fluidized bed, some of the silane gas undergo a heterogeneous reaction and deposit on surface of silicon particle, and another of the silane gas undergo a homogeneous reaction to generate a gas phase micronucleus. The gas phase micronucleus is generated by a series processes of polymerization core growth, during which generated silicon powder is adhered to the surface of the silicon particle and becomes part of silicon product.

Physicochemical characteristics of the silicon powder mainly include that: the raw polycrystalline silicon powder with less particle size has an influence on pulling single crystal in a Czochralski single crystal furnace; the raw polycrystalline silicon powder has a purity at ppm level, and contains some amorphous silicon and other impurities, which affects the single crystal growth in Czochralski method and is easy to cause broken bracts. Currently, use of the raw polycrystalline silicon powder on pulling single crystal in the Czochralski single crystal furnace is in shortage.

TECHNICAL PROBLEM

The present application provides a charging method for a silicon material to solve problem of lack of a reasonable process of charging a crucible upon pulling a single crystal in a single crystal furnace. Another object of the present application is to provide a preparation method for a single crystal for solving a problem that a current material process affects a single crystal growth upon preparing the single crystal.

TECHNICAL SOLUTION

In a first aspect, a charging method for silicon charge, wherein the method is used for charging a crucible with a silicon charge, and includes:

disposing the first material layer in the crucible;

disposing a second material layer on a side of the first material layer away from a bottom of the crucible, to cover the first material layer during vacuuming.

In some embodiments, in a first direction of the crucible, the crucible has a height $h_1$, the first material layer has a first thickness $d_1$, and the height $h_1$ and the first thickness $d_1$ satisfy: $d_1 \leq 4/5\ h_1$; and/or in the first direction of the crucible, the second material layer has a second thickness $d_2$ satisfying $d_2 \geq 40$ mm.

In some embodiments, silicon material of the first material layer has a first particle size $D_1$ and silicon material of the second material layer has a second particle size $D_2$, the first particle size $D_1$ and second particle size $D_2$ satisfy: $D_1 < D_2$; wherein the first particle size $D_1$ ranges from 0.1 μm to 1000 μm; and/or the second particle size $D_2$ ranges from 1 mm to 3 mm.

In some embodiments, the method further includes: disposing a third material layer on the second material layer; wherein silicon material of the third material layer has a third particle size $D_3$ satisfying $D_2 < D_3$; and the third particle size $D_3$ ranges from 10 mm to 70 mm.

In some embodiments, in a first direction of the crucible, until the third material layer is filled in the crucible, the third material layer has a maximum thickness $d_4$ beyond the height $h_1$ of the crucible, wherein the maximum thickness $d_4$ satisfies: $d_4 < 150$ mm; and/or in the first direction of the crucible, the first material layer has a first thickness $d_1$, the second material layer has a second thickness $d_2$, and the third material layer has a third thickness $d_3$, wherein the first thickness $d_1$, the second thickness $d_2$, and the third thickness $d_3$ satisfy: $d_1 > d_2 > d_3$.

In some embodiments, the first thickness $d_1$, the second thickness $d_2$, the third thickness $d_3$, and the height $h_1$ satisfy: $d_1 + d_2 + d_3 \geq h_1$.

According to a second aspect, an embodiment of the present application also provides a preparation method for single crystal using the charging method for silicon material as described above, the method includes:

covering a pot lid, the crucible to define a closed crucible body, and vacuuming the closed crucible body; and lifting the closed crucible body into a single crystal furnace, and relieving pressure from the closed crucible body.

In some embodiments, time for vacuuming ranges from 2 min to 5 min; and/or, a final pressure for vacuuming ranges from −0.08 MPa to 0.1 MPa; and/or, time for reliving pressure ranges from 2 min to 5 min.

In some embodiments, the single crystal furnace includes a valve and a pressure gauge, and after relieving pressure from the closed crucible body, the method further includes:

removing the pot lid;

setting an initial value of opening degree of the valve to 0%;

providing a change magnitude in values of the pressure gauge less than 1 torr and the opening degree of the valve with 5% to 15%; and stabilizing pressure of the single crystal furnace, checking a leakage of the single crystal furnace to obtain a detection leakage rate, and setting the pressure of the single crystal furnace to be less than or equal to a preset pressure value, to complete the vacuuming.

In some embodiments, the preset pressure value ranges from 40 mtorr to 60 mtorr; and/or, the leakage detection rate is less than or equal to a range from 120 mtorr/h to 150 mtorr/h.

In some embodiments, the single crystal furnace includes a first heater and a second heater; after the vacuuming, the method further includes:

providing power of the first heater with 80 kw to 100 kw, power of the second heater with 50 kw to 70 kw, the pressure of the single crystal furnace with 10 torr to 15 torr; supplying argon with flow rate ranging from 40 slpm to 50 slpm to the single crystal furnace; and providing the crucible with 0.5 to 1.5 turns until the silicon material completely melted into a liquid; and performing a volatilization, in a case that the power of the first heater is provided with 60 kw to 80 kw, the power of the second heater is provided with 10 kw to 20 kw, and the pressure in the single crystal furnace is provided with 4 torr to 7 torr.

In some embodiments, after the volatilization, a silicon material having a third particle size $D_3$ is re-fed.

In some embodiments, after the volatilization and before re-feeding the silicon material having the third particle size $D_3$, the method further includes:

cooling the liquid, and contacting fine-grained seed crystals with a liquid level of the liquid to form a crystal interface, perform a first slag sticking.

In some embodiments, step of cooling the liquid, and contacting fine-grained seed crystal with a liquid level of the liquid to form a crystal interface includes:

providing the power of the first heater with 50 kw to 70 kw to cool the liquid; and providing the crystal with a rotate speed from 1 rpm to 2 rpm, the crucible with a rotate speed from 2 rpm to 5 rpm; raising fine crystal end to the liquid level by 100 mm to 150 mm; and then taking out for the first slag sticking.

In some embodiments, after re-feeding the silicon material having the third particle size $D_3$, the method further includes:

processing the silicon material having the third particle size $D_3$ after re-feeding; in a case that the silicon material remains 1 kg to 2 kg, the fine-grained seed crystals are stuck to the remaining silicon material, and floating impurities at the liquid level are dipped, to perform a second slag sticking.

BENEFICIAL EFFECT

In comparison with the prior art, a charging method for silicon material used for charging a crucible with a silicon material includes: disposing the first material layer in the crucible; and disposing a second material layer on a side of the first material layer away from a bottom of the crucible, to cover the first material layer during vacuuming. According to the charging method for silicon material provided in the present application, the first material layer is disposed in the crucible, and the second material layer is disposed on the side of the first material layer away from the bottom of the crucible, so that the first material layer is covered by the second material layer in the vacuuming, and the first material layer cannot be blown out of the crucible, thereby realizing a reasonable charging step. The charging method for silicon material provided in the present application can solve a problem t of lack of a reasonable process of charging a crucible upon preparing a single crystal in a single crystal furnace.

It is appreciated that, in comparison with the prior art, a preparation method for single crystal provided in the embodiments of the present application employs the charging method as described above, and the preparation method for single crystal includes: covering a pot lid on the crucible to define a closed crucible body, and vacuuming the closed crucible body; lifting the closed crucible body into a single crystal furnace, and relieving pressure from the closed crucible body. The steps of vacuuming the closed crucible body and relieving pressure out of the closed crucible body provide favorable conditions for a single crystal pulling process, so that a silicon material cannot be sucked during preparing the single crystal. The preparation method for single crystal can solve the problem that a current material process affects a single crystal growth upon preparing the single crystal. The preparation method for single crystal has all the technical features and beneficial effects of the above-mentioned charging method, and details are not described herein.

REFERENCE NUMERALS

100—crucible, 210—first material layer, 220—second material layer, 230—third material layer, 300—pot lid.

DETAILED DESCRIPTION OF THE EMBODIMENTS

The present application provides a charging method for a silicon material and a preparation method for a single crystal. To make the object, technical solution and effect of the present application clearer and definite, the present application is described in further detail with reference to the accompanying drawings and examples. It should be understood that the specific embodiments described herein are merely illustrative of the present application and are not intended to limit the present application.

Figure 1:
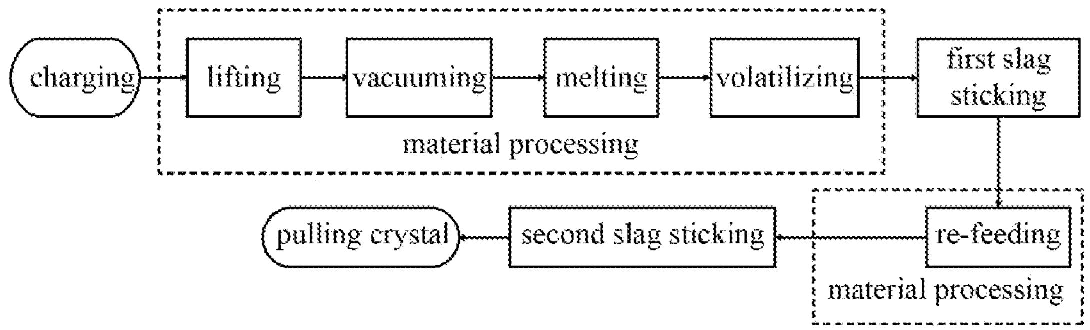
FIG. 1 is a schematic diagram of a process for preparing a single crystal of the present application.
Figure 2:
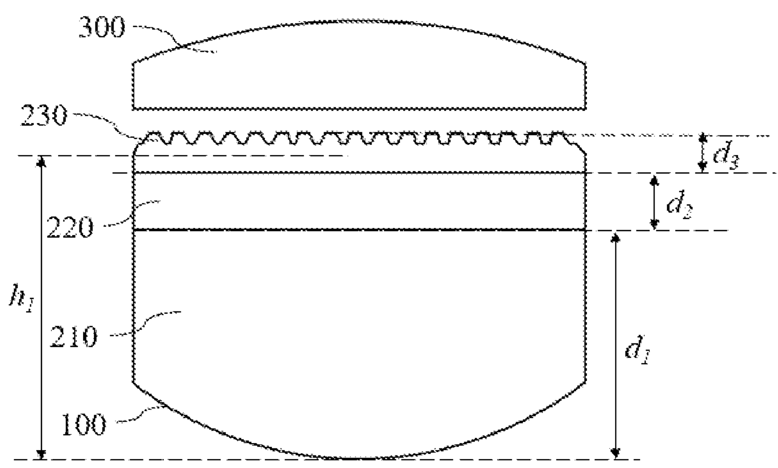
FIG. 2 is a schematic diagram showing that a pot lid moves downward to a crucible until charging is completed and showing a structure of the pot lid according to an embodiment of the present application.
Figure 3:
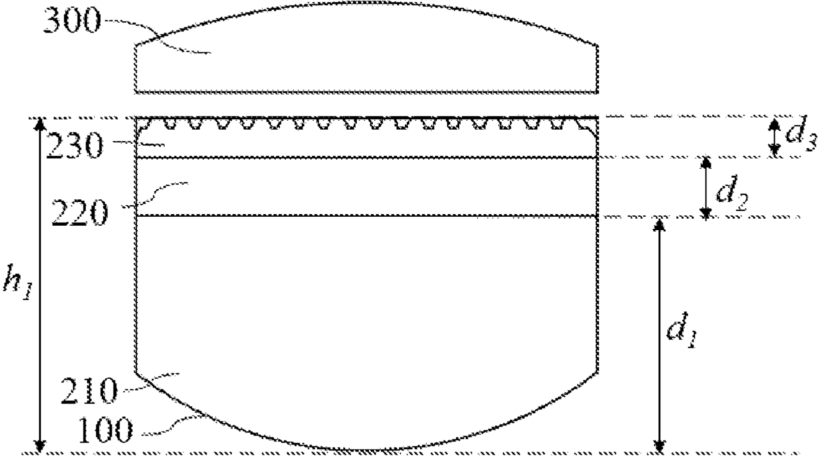
FIG. 3 is another schematic diagram showing that a pot lid moves downward to a crucible until charging is completed and showing a structure of the pot lid according to an embodiment of the present application.
Figure 4:
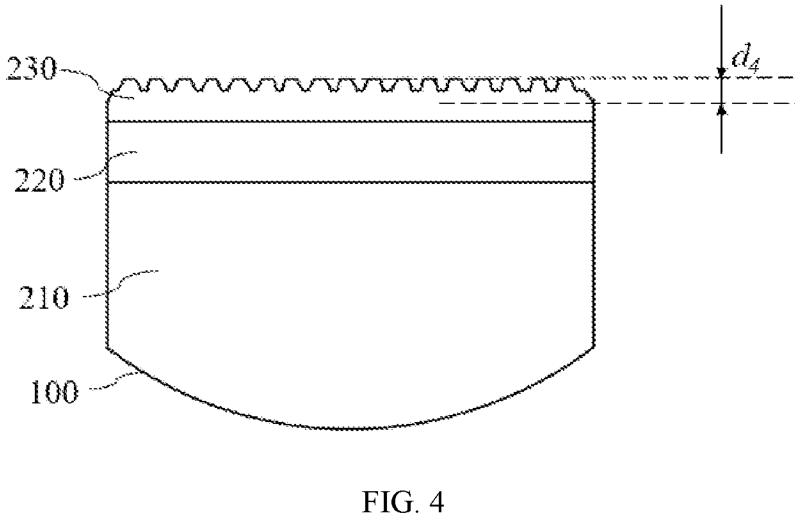
FIG. 4 is a schematic diagram showing a third material layer being above a crucible.

Reference is made to FIGS. 1 to 3, wherein FIG. 3 provides a charging method for a silicon material for charging a silicon material into a crucible 100. The charging method including:

disposing a first material layer 210 in a crucible 100;

disposing a second material layer 220 on a side of the first material layer 210 away from a bottom of the crucible 100, to cover the first material layer 210 during vacuuming. That is, by disposing the second material layer 220 on the side of the first material layer 210 away from the bottom of the crucible 100, the first material layer 210 is capped by the second material layer 220. As such, the first material layer 210 is completely covered by the second material layer 220, to prevent the first material layer 210 from being blown out of the crucible 100.

According to a preparation method for a single crystal provided in the present application, the first material layer 210 is disposed in the crucible 100, and the second material layer 220 is provided on the side of the first material layer 210 away from the bottom of the crucible 100, so that the second material layer 220 covers the first material layer 210 during vacuuming. Therefore, by filling the crucible 100 with silicon material and the silicon material including the first material layer 210 and the second material layer 220, the second material layer 220 covers the first material layer 210 completely, thereby properly charging the crucible 100. The charging method for the silicon material can solve the problem of lack of a reasonable process of charging a crucible upon preparing a single crystal in a single crystal furnace.

In some embodiments of the present application, along a first direction X of the crucible 100, the crucible 100 has a height $h_1$ and the first material layer 210 has a first thickness $d_1$, and the height $h_1$ and the first thickness $d_1$ satisfy: $d_1 \leq 4/5h_1$.

In a further embodiment, the height $h_1$ and the first thickness $d_1$ further satisfy: $d_1 \leq 3/4h_1$.

Thus, by defining a relative proportional relationship between the first thickness $d_1$ of the first material layer 210 and the height $h_1$ of the crucible 100, the first material layer 210 can be reasonably disposed inside the crucible 100.

In some embodiments, along the first direction X of the crucible 100, the second material layer 220 has a second thickness $d_2$ that satisfies: $d_2 \geq 40$ mm. A reasonable design for thickness range of the second material layer 220 in the crucible 100 is achieved by defining an absolute range of the second thickness $d_2$ of the second material layer 220.

In some embodiments, the silicon material of the first material layer 210 has a first particle size $D_1$ and the silicon material of the second material layer 220 has a second particle size $D_2$, wherein the first particle size $D_1$ and the second particle size $D_2$ satisfy: $D_1 < D_2$. In this embodiment, the first material layer 210 is more compact relative to the second material layer 220.

In the above embodiment, it should be noted that the material of the first material layer 210 is raw polycrystalline silicon powder, and the first particle size $D_1$ ranges from 0.1 μm to 1000 μm. The material of the second material layer 220 is silicon powder, and the second particle size $D_2$ ranges from 1 mm to 3 mm. In some embodiments, the first particle size $D_1$ may be 0.1 μm, 1 μm, 10 μm, 100 μm, 500 μm, 1000 μm, or a range between any two values above. The second particle size D2 may be 1 mm, 1.5 mm, 2 mm, 2.5 mm, 3 mm, or a range between the above values. By sizing the first particle size $D_1$ of the first material layer 210 and the second particle size $D_2$ of the second material layer 220, it is advantageous to reasonably charge the first material layer 210 and/or the second material layer 220.

In other embodiments of the present application, a difference from the above embodiments is that after the second material layer 220 is disposed on the first material layer 210, the charging method for the silicon material further includes:

disposing a third material layer 230 on the second material layer 220. This is, the third material layer 230 caps the second material layer 220. The silicon material of the third material layer 230 has a third particle size $D_3$ satisfying $D_2 < D_3$. By setting the second particle size $D_2$ to be less than the third particle size $D_3$, a more compact design for the second material layer 220 with respect to the third material layer 230 is achieved.

Based on the above embodiment, the filled silicon material includes the first material layer 210, the second material layer 220, and the third material layer 230. In some embodiments, the material of the third material layer 230 is a silicon material, and the third particle size $D_3$ ranges from 10 mm to 70 mm. In some embodiments, the third particle size $D_3$ may be 10 mm, 20 mm, 30 mm, 40 mm, 50 mm, 60 mm, 70 mm, or a range between any two values above, to achieve the purpose of reasonably charging the third layer 230.

In some embodiments, as shown in FIG. 2 and FIG. 3, in order to fill the crucible 100 as much of the raw material as possible, the crucible 100 is filled with the third material layer 230 in the first direction X of the crucible 100. The third material layer 230 has a maximum thickness $d_4$ beyond the height $h_1$ of the crucible 100, this is, the silicon material as the raw material may allow the third material layer 230 to exceed the crucible 100 to the maximum thickness $d_4$, wherein the maximum thickness $d_4$ satisfies: $d_4 < 150$ mm. In some embodiments, the maximum thickness $d_4$ may be 120 mm, 125 mm, 130 mm, 135 mm, 140 mm, 145 mm, or a range between any two values above, thereby limiting the third material layer 230 beyond the crucible 100 to the maximum extent. The third material layer 230 beyond the height of the crucible 100 is limited in the maximum extent, to ensure reasonable charging of the third material layer 230.

In some embodiments, along the first direction X of the crucible 100, the second material layer 220 has a second thickness $d_2$, and the third material layer 230 has a third thickness $d_3$, which satisfies: $d_1 > d_2 > d_3$. That is, the second thickness $d_2$ of the second material layer 220 is less than the first thickness $d_1$ of the first material layer 210, and the third thickness $d_3$ of the third material layer 230 is less than the second thickness $d_2$ of the second material layer 220. That is, the thickness of the first material layer 210, the second material layer 220, and the third material layer 230 in the first direction X presents a gradually decreasing design.

In some embodiments, as shown in FIG. 2, $d_1+d_2+d_3>h1$. That is, by providing the sum of the first thickness $d_1$ of the first material layer 210, the second thickness $d_2$ of the second material layer 220, and the third thickness $d_3$ of the third material layer 230 greater than the height of the crucible 100, a top of the third material layer 230 exceeds the crucible 100, thereby filling the crucible 100 with the raw materials as much as possible.

In some embodiments, as shown in FIG. 3, $d_1+d_2+d_3=h_1$. That is, the sum of the first thickness $d_1$ of the first material layer 210, the second thickness $d_2$ of the second material layer 220, and the third thickness $d_3$ of the third material layer 230 is equal to the height of the crucible 100. With condition of $d_1+d_2+d_3=h_1$, the crucible 100 is just full of the raw materials without overcharge. Mover, to obtain the condition of $d_1+d_2+d_3=h_1$, merely actual requirements of the charging method for silicon material in the present application need to be met, and the specific dimensions need to be set according to the actual requirements on raw material and the requirements on the subsequent single crystal preparation.

According to the above-described charging method for the silicon material of the present application, the first material layer 210 is disposed in the crucible 100, and the second material layer 220 is disposed in the first material layer 210, so that a reasonable charging step is realized. The charging step is applicable to a charging step in single crystal preparation, thereby solving a problem that a reasonable charging step is not performed in single crystal preparation in a single crystal furnace.

The present application also provides a preparation method for a single crystal, using a charging method for a silicon material as described above. The method including:

step 100: covering a pot lid 300 on the crucible 100 to define a closed crucible body, and vacuuming the closed crucible body; and step 200: lifting the closed crucible body into a single crystal furnace, and relieving pressure from the closed crucible body.

In step 100 and step 200, the time for vacuuming ranges from 2 min to 5 min; and/or a final pressure for vacuuming ranges from −0.08 MPa to 0.1 MPa; and/or, the time for relieving pressure ranges from 2 min to 5 min.

In this step 100, the pot lid 300 is sucked to a negative pressure. In order to prevent the silicon powder in the crucible 100 from being sucked out after charging, the pressure gauge changes are observed during the vacuuming. The vacuuming is performed slowly by slowly adjusting the vacuuming valve, and the time for vacuuming is controlled at 2 min to 5 min while the speed for vacuuming is controlled. And/or by controlling the pressure for vacuuming at −0.08 MPa to 0.1 MPa, the vacuum valve is closed after the dial of the pressure gauge has no changes. In some embodiments, the time for vacuuming may be 2 min, 2.5 min, 3 min, 3.5 min, 4 min, 4.5 min, 5 min, or a range between any two values above. The pressure may be −0.08 Mpa, −0.06 Mpa, −0.4 Mpa, −0.02 Mpa, 0 Mpa, 0.02 Mpa, 0.04 Mpa, 0.06 Mpa, 0.08 Mpa, 0.1 Mpa, or a range between any two values above.

In step 200, the closed crucible body is lifted into the single crystal furnace, and then the pressure relief valve needs to be slowly opened to relieve pressure. The pressure relief process needs to be carried out slowly. The time for relieving pressure for the closed crucible body may be 2 min, 2.5 min, 3 min, 3.5 min, 4 min, 4.5 min, and 5 min, or a range between any two values above.

The preparation method for the single crystal of the present application is performed by covering a pot lid on the crucible to define a closed crucible body, and vacuuming the closed crucible body; lifting the closed crucible body into a single crystal furnace, and relieving pressure from the closed crucible body. Thus, the vacuuming and pressure relief process provides conditions for the pulling single crystal process.

Figure 5:
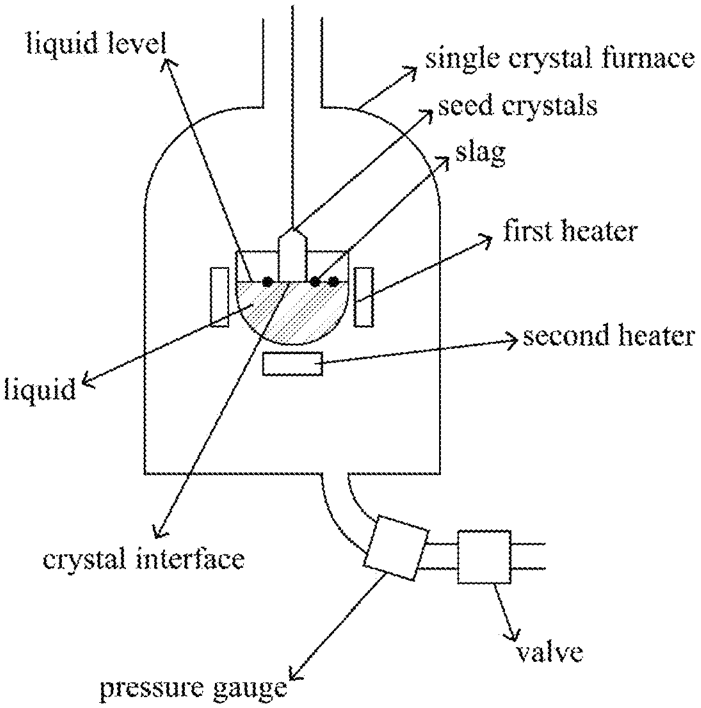
FIG. 5 is schematic diagram showing a structure for preparing a single crystal of the present application.

Referring to FIG. 5, it shows a structure for preparing a single crystal of the present application. The single crystal furnace includes a valve and a pressure gauge. After relieving pressure from the closed crucible body, the step 300 further includes:

step S310: closing the single crystal furnace after removing the pot lid 300;

Step S320: setting an initial value of opening degree of the valve to 0%;

Step S330: providing a change magnitude in values of the pressure gauge less than 1 torr and the opening degree of the valve with 5% to 15%; wherein the change magnitude in values of the pressure gauge may be 0.05 torr, 0.06 torr, 0.07 torr, 0.08 torr, 0.09 torr, or a range between any two values above; and the opening degree of the valve may be 5%, 6%, 7%, 8%, 9%, 10%, 11%, 12%, 13%, 14%, 15%, or a range between any two values above.

In an embodiment of the present application, the valve is a throttle valve and the pressure gauge is a hundred torr gauge.

In steps S310 to S330, by defining the opening degree of the valve and the change magnitude in values of the pressure gauge, and setting the process condition for vacuuming the closed crucible body and relieving pressure from the closed crucible, the silicon material cannot be sucked out during the single crystal preparation process.

Step S340: stabilizing the pressure of the single crystal furnace, checking a leakage of the single crystal furnace to obtain a detection leakage rate, and setting the pressure of the single crystal furnace to be less than or equal to a preset pressure value, to complete the vacuuming. The previous step, step S330, is repeated, and the opening degree is superimposed each time at 5% to 15% until the degree opening reaches 100% to stabilize the pressure of the single crystal furnace.

In this step S340, in some embodiments, for a single crystal furnace, the preset pressure value ranges from 40 mtorr to 60 mtorr, and/or the leakage detection rate is less than or equal to a range from 120 mtorr/h to 150 mtorr/h. In some embodiments, the preset pressure value may be 40 mtorr, 45 mtorr, 50 mtorr, 55 mtorr, 60 mtorr, or a range between any two values above. In some embodiments, the leakage detection rate may be 120 mtorr/h, 125 mtorr/h, 130 mtorr/h, 135 mtorr/h, 140 mtorr/h, 145 mtorr/h, 150 mtorr/h, or a range between any two values above. In the present step S340, by defining the preset pressure value and/or the leakage detection rate, the vacuuming during the single crystal preparation is accomplished so that the silicon material cannot be sucked out of the crucible 100.

In some embodiments, the single crystal furnace includes a first heater and a second heater, the first heater is a primary heater and the second heater is a bottom heater. After the vacuuming, the preparing method for the single crystal provided herein further includes:

step 400: providing power of the first heater with 80 kw to 100 kw, power of the second heater with 50 kw to 70 kw, pressure in the single crystal furnace with 10 torr to 15 torr; supplying argon with flow rate ranging from 40 slpm to 50 slpm to the single crystal furnace; and providing the crucible with 0.5 to 1.5 turns, specifically 1 turn, until the silicon material is completely melted into a liquid. Step 400 is for melting.

In this step 400, the power of the first heater may be 80 kw, 85 kw, 90 kw, 95 kw, 100 kw, or a range between any two values above. The power of the second heater may be 50 kw, 55 kw, 60 kw, 65 kw, 65 kw, 70 kw, or a range between any two values above. The pressure in the single crystal furnace may be 10 torr, 11 torr, 12 torr, 13 torr, 14 torr, 15 torr, or a range between any two values above. The flow rate of the argon may be 40 slpm, 41 slpm, 42 slpm, 43 slpm, 44 slpm, 45 slpm, 46 slpm, 47 slpm, 48 slpm, 49 slpm, 50 slpm, or a range between any two values above.

The vacuuming of the above-mentioned step 300 and the melting of the step 400 extend the material process time with the low power for melting, thereby providing an effective condition for the Czochralski single crystal in the preparation method for the single crystal of the present application.

Step 500: after melting the silicon material completely into the liquid, performing a volatilization; wherein the power of the first heater is provided with 60 kw to 80 kw, the power of the second heater is provided with 10 kw to 20 kw, and the pressure in the single crystal furnace is provided with 4 torr to 7 torr.

In this step 500, the time for volatilization is 1 hour and high temperature for volatilization is continued.

In this step 500, in some embodiments, the power of the first heater may be 60 kw, 65 kw, 70 kw, 75 kw, 80 kw, or a range between any two values above; the power of the second heater may be 10 kw, 11 kw, 12 kw, 13 kw, 14 kw, 15 kw, 16 kw, 17 kw, 18 kw, 19 kw, 20 kw, or a range between any two values above; and the pressure in the single crystal furnace may be 4 torr, 4.5 torr, 5 torr, 5.5 torr, 6 torr, 6.5 torr, 7 torr, or a range between any two values above. By providing the volatilization after vacuuming and melting, the insoluble impurities can be removed after the volatilization, thereby achieving the technical effect of optimizing the material process. The volatilization provides condition support for pulling single crystal after the melting.

After high temperature volatilization according to step 500, the preparation method for the single crystal of the present application further includes:

Step 600: cooling the liquid, and contacting the fine-grained seed crystal with the liquid level of the liquid to form a crystal interface, to perform the first slag sticking.

In step 600, the method further includes:

Step 610: providing the power of the first heater with 50 kw to 70 kw to cool the liquid. In this step 610, the power of the first heater may be 50 kw, 55 kw, 60 kw, 65 kw, 70 kw, or a range between any two values above.

In step 610, to cool the liquid, the power of the second heater is 0 kw.

Step 620: providing the crystal with a rotate speed from 1 rpm to 2 rpm, the crucible with a rotate speed from 2 rpm to 5 rpm; raising the fine crystal end to the liquid level by 100 mm to 150 mm; and then performing the first slag sticking.

In the step 600 and step 610, the power of the first heater, the power of the second heater, the rotate speed of the crystal, the rotate speed of the crucible, and the distance from the fine crystal end to the liquid level are all set within a reasonable range so as to complete the first slag sticking, thereby removing insoluble impurities during charging and material process.

In this step 620, the rotate speed rpm of the crystal may be 1 rpm, 1.1 rpm, 1.2 rpm, 1.3 rpm, 1.4 rpm, 1.5r pm, 1.6 rpm, 1.7 rpm, 1.8 rpm, 1.9 rpm, 2 rpm, or a range between any two values above. The rotate speed of the crucible may be 2 rpm, 2.5 rpm, 3 rpm, 3.5 rpm, 4 rpm, 4.5 rpm, 5 rpm, or a range between any two values above.

After the first slag sticking in step 600 and step 620, the preparation method for the single crystal of the present application further includes:

Step 700: re-feeding of a silicon material having a third particle size $D_3$.

In the present step 700, by re-feeding the silicon material having the third particle size $D_3$, the silicon material is re-fed so as to increase the amount of the silicon material to be put into production to the maximum extent. The re-feeding process provides flow support for the entire process for preparing the single crystal of charging, material process, re-feeding, and material process.

After step 700 is performed, the silicon material has the third particle size $D_3$. After step 700 is completed, the method further includes:

step 800: processing the silicon material having the third particle size $D_3$ after re-feeding. Once the silicon material remains 1 kg to 2 kg, the fine-grained seed crystals are stuck to the remaining silicon material, and floating impurities at the liquid level are dipped, to perform the second slag sticking.

It should be noted that in the present step 800, after the silicon material is re-fed, the effect of removing the insoluble impurities carried by the re-fed silicon material is achieved by performing the steps of processing the re-fed silicon material and sticking the slag for the second time.

Step 900: performing an automatic crystal pulling process and remaining crystal pulling steps.

In the above-mentioned step 100 to step 800 of the present application, the materials are lifted, vacuumed, melted, and volatilized successively according to the above-mentioned step 100 to step 500; the first slag sticking is performed on the treated material according to step 600; After re-feeding the silicon material having the third particle size $D_3$ according to step 700, the method further includes the step of processing the silicon material having the third particle size $D_3$, that is, the silicon material having the third particle size $D_3$ is re-fed according to the above-mentioned charging method for the silicon material, then being lifted, vacuumed, melted, and volatilized successively according to the above-mentioned step 100 to step 500; finally the silicon material having the third particle size $D_3$ is re-fed according to step 700, and the second slag sticking is performed on the re-fed material according to step 800.

The present application provides a charging method for a silicon material and a preparation method for a single crystal, which can solve the problem of lack of a reasonable charging process and material process for pulling a single crystal in a single crystal furnace, and can solve the problem that a current material process affects a single crystal growth upon preparing the single crystal. Thus, a probability of a single crystal having an equal diameter length greater than 1000 mm is increased by a certain percentage.

Therefore, according to the preparation method for the single crystal provided in the present application, a silicon material is charged by the charging method for the silicon material as described above, and the preparation method for the single crystal includes: covering a pot lid 300 on the crucible 100 to define a closed crucible body, and vacuuming the closed crucible body; relieving pressure from the closed crucible body, removing the closed crucible body and closing the single crystal furnace for vacuuming. Thus, the vacuuming is improved, to process the silicon material in the single crystal furnace. Through optimization of the material process, the silicon material is processed in a low-power condition, so that the time for processing materials is prolonged, volatilization is completed after processing materials, and insoluble impurities are removed. By re-feeding the silicon material having the third particle size $D_3$ and processing the materials, the charging and the processing can be repeated, so that the amount of the silicon material as a raw material for preparing the single crystal is increased. Before and after re-feeding the silicon material having the third particle size $D_3$, the insoluble impurities are removed by the first slag sticking and the second slag sticking, so that the silicon material is used as a raw material to for pulling single crystal in production of a single crystal silicon rod.

According to the preparation method for the single crystal provided by the present application, through optimization of the material process, the silicon material is processed in a low-power condition, so that the time for processing materials is prolonged, volatilization is completed after processing materials, insoluble impurities are removed by two times of slag sticking, and application of silicon powder as a raw material in Czochralski method for producing a single crystal silicon rod is realized. Thus, the preparation method for the single crystal can solve the problem that the current material process affects the single crystal growth upon preparing the single crystal.

The above describes in detail a charging method for a silicon material and a preparation method for a single crystal according to an embodiment of the present application. Specific examples are used to illustrate the principles and embodiments of the present application. The description of the above examples is merely provided to help understand the method and the core idea of the present application. At the same time, variations will occur to those skilled in the art in both the detailed description and the scope of application in accordance with the teachings of the present application. In view of the foregoing, the present description should not be construed as limiting the application.

The invention claimed is:

1. A charging method for silicon material, wherein the method is used for charging a crucible with a silicon charge, and comprises:

disposing the first material layer in the crucible;

disposing a second material layer on a side of the first material layer away from a bottom of the crucible, to cover the first material layer during vacuuming; and disposing a third material layer on a side of the second material layer away from the bottom of the crucible, wherein silicon material of the first material layer has a first particle size $D_1$, silicon material of the second material layer has a second particle size $D_2$, and silicon material of the third material layer has a third particle size $D_3$, satisfying $D_1<D_2<D_3$.

2. The charging method for silicon material of claim 1, wherein, in a first direction of the crucible, the crucible has a height $h_1$, the first material layer has a first thickness $d_1$, and the height $h_1$ and the first thickness $d_1$ satisfy: $d_1 \leq 4/5\, h_1$; and/or, in the first direction of the crucible, the second material layer has a second thickness $d_2$ satisfying $d_2 \geq 40$ mm.

3. The charging method for silicon material of claim 1, wherein the first particle size $D_1$ ranges from 0.1 μm to 1000 μm; and/or, the second particle size $D_2$ ranges from 1 mm to 3 mm.

4. The charging method for silicon material of claim 1, wherein the third particle size $D_3$ ranges from 10 mm to 70 mm.

5. The charging method for silicon material of claim 4, wherein in a first direction of the crucible, until the third material layer is filled in the crucible, the third material layer has a maximum thickness $d_4$ beyond the height $h_1$ of the crucible, wherein the maximum thickness $d_4$ satisfies: $d_4<150$ mm; and/or, in the first direction of the crucible, the first material layer has a first thickness $d_1$, the second material layer has a second thickness $d_2$, and the third material layer has a third thickness $d_3$, wherein the first thickness $d_1$, the second thickness $d_2$, and the third thickness $d_3$ satisfy: $d_1>d_2>d_3$.

6. The charging method for silicon material of claim 5, wherein the first thickness $d_1$, the second thickness $d_2$, the third thickness $d_3$, and the height $h_1$ satisfy: $d_1+d_2+d_3 \geq h_1$.

7. A preparation method for single crystal, comprising charging silicon material into a crucible, wherein the charging silicon material comprises:

disposing a first material layer in the crucible;

disposing a second material layer on a side of the first material layer away from a bottom of the crucible, to cover the first material layer during vacuuming; and disposing a third material layer on a side of the second material layer away from the bottom of the crucible, wherein silicon material of the first material layer has a first particle size $D_1$, silicon material of the second material layer has a second particle size $D_2$, and silicon material of the third material layer has a third particle size $D_3$, satisfying $D_1<D_2<D_3$.

wherein the preparation method for single crystal further comprises:

covering a pot lid on the crucible to define a closed crucible body, and vacuuming the closed crucible body; and lifting the closed crucible body into a single crystal furnace, and relieving pressure from the closed crucible body.

8. The preparation method for single crystal of claim 7, wherein time for vacuuming ranges from 2 min to 5 min;

and/or, a final pressure for vacuuming ranges from −0.08 MPa to 0.1 MPa;

and/or, time for reliving pressure ranges from 2 min to 5 min.

9. The preparation method for single crystal of claim 7, wherein the single crystal furnace comprises a valve and a pressure gauge, and after relieving pressure from the closed crucible body, the method further comprises:

removing the pot lid;

setting an initial value of opening degree of the valve to 0%;

providing a change magnitude in values of the pressure gauge less than 1 torr and the opening degree of the valve with 5% to 15%; and stabilizing pressure of the single crystal furnace, checking a leakage of the single crystal furnace to obtain a detection leakage rate, and setting the pressure of the single crystal furnace to be less than or equal to a preset pressure value, to complete the vacuuming.

10. The preparation method for single crystal of claim 9, wherein the preset pressure value ranges from 40 mtorr to 60 mtorr;

and/or, the leakage detection rate is less than or equal to a range from 120 mtorr/h to 150 mtorr/h.

11. The preparation method for single crystal of claim 9, wherein the single crystal furnace comprises a first heater and a second heater; after the vacuuming, the method further comprises:

providing power of the first heater with 80 kw to 100 kw, power of the second heater with 50 kw to 70 kw, the pressure of the single crystal furnace with 10 torr to 15 torr; supplying argon with flow rate ranging from 40 slpm to 50 slpm to the single crystal furnace; and setting the crucible to rotate at 0.5 to 1.5 turns until the silicon material completely melted into a liquid; and performing a volatilization, in a case that the power of the first heater is provided with 60 kw to 80 kw, the power of the second heater is provided with 10 kw to 20 kw, and the pressure in the single crystal furnace is provided with 4 torr to 7 torr.

12. The preparation method for single crystal of claim 11, wherein after the volatilization, the silicon material having the third particle size $D_3$ is re-fed.

13. The preparation method for single crystal of claim 12, wherein after the volatilization and before re-feeding the silicon material having the third particle size $D_3$, the method further comprises:

cooling the liquid, and contacting seed crystals with a liquid level of the liquid to form a crystal interface, perform a first slag sticking.

14. The preparation method for single crystal of claim 13, wherein step of cooling the liquid, and contacting seed crystal with a liquid level of the liquid to form a crystal interface comprises:

providing the power of the first heater with 50 kw to 70 kw to cool the liquid; and providing the crystal with a rotate speed from 1 rpm to 2 rpm, the crucible with a rotate speed from 2 rpm to 5 rpm; raising crystal end to the liquid level by 100 mm to 150 mm; and then taking out for the first slag sticking.

15. The preparation method for single crystal of claim 13, wherein after re-feeding the silicon material having the third particle size $D_3$, the method further comprises:

processing the silicon material having the third particle size $D_3$ after re-feeding; in a case that the silicon material remains 1 kg to 2 kg, the seed crystals are stuck to the remaining silicon material, and floating impurities at the liquid level are dipped, to perform a second slag sticking.

16. The preparation method for single crystal of claim 15, further comprising: performing an automatic crystal pulling process.

17. The preparation method for single crystal of claim 7, wherein in a first direction of the crucible, the crucible has a height $h_1$, the first material layer has a first thickness $d_1$, and the height $h_1$ and the first thickness $d_1$ satisfy: $d_1 \leq 4/5\, h_1$; and the second material layer has a second thickness $d_2$ satisfying $d_2 \geq 40$ mm.

18. The preparation method for single crystal of claim 17, wherein a maximum thickness $d_4$ of the third material layer beyond the height $h_1$ of the crucible satisfies: $d_4 < 150$ mm.

19. The preparation method for single crystal of claim 18, wherein the third material layer has a third thickness $d_3$, and the first thickness $d_1$, the second thickness $d_2$, the third thickness $d_3$, and the height $h_1$ satisfy: $d_1+d_2+d_3 \geq h_1$, and $d_1>d_2>d_3$.

20. The preparation method for single crystal of claim 7, wherein the first particle size $D_1$ ranges from 0.1 μm to 1000 μm; and the second particle size $D_2$ ranges from 1 mm to 3 mm.

* * * * *